US012564052B2

(12) United States Patent
Refai-Ahmed et al.

(10) Patent No.: US 12,564,052 B2
(45) Date of Patent: Feb. 24, 2026

(54) CHIP PACKAGE WITH PASS THROUGH HEAT SPREADER

(71) Applicant: XILINX, INC., San Jose, CA (US)

(72) Inventors: Gamal Refai-Ahmed, Santa Clara, CA (US); Suresh Ramalingam, Fremont, CA (US)

(73) Assignee: XILINX, INC., San Jose, CA (US)

( * ) Notice: Subject to any disclaimer, the term of this patent is extended or adjusted under 35 U.S.C. 154(b) by 626 days.

(21) Appl. No.: 17/851,937

(22) Filed: Jun. 28, 2022

(65) Prior Publication Data

US 2023/0420335 A1 Dec. 28, 2023

(51) Int. Cl.
| | |
|---|---|
| *H01L 23/40* | (2006.01) |
| *H01L 21/48* | (2006.01) |
| *H01L 23/00* | (2006.01) |
| *H01L 23/46* | (2006.01) |
| *H01L 23/498* | (2006.01) |
| *H01L 25/065* | (2023.01) |

(52) U.S. Cl.
CPC .......... *H01L 23/4006* (2013.01); *H01L 23/46* (2013.01); *H01L 23/49833* (2013.01); *H01L 25/0655* (2013.01); *H01L 21/4882* (2013.01); *H01L 2023/405* (2013.01); *H01L 2023/4062* (2013.01); *H01L 2023/4068* (2013.01); *H01L 2023/4087* (2013.01); *H01L 23/49816* (2013.01); *H01L 24/16* (2013.01); *H01L 2224/16225* (2013.01)

(58) Field of Classification Search
CPC ............................................. H01L 2023/4056
See application file for complete search history.

(56) References Cited

U.S. PATENT DOCUMENTS

| | | | | |
|---|---|---|---|---|
| 7,405,931 | B2 * | 7/2008 | Saturley | .................... G06F 1/20 |
| | | | | 361/679.48 |
| 7,663,883 | B2 * | 2/2010 | Shirakami | ............. H01L 23/373 |
| | | | | 174/15.2 |
| 8,574,965 | B2 * | 11/2013 | Refai-Ahmed | ....... H01L 25/115 |
| | | | | 257/E23.001 |
| 9,681,583 | B2 * | 6/2017 | Lei | ..................... H05K 7/20409 |
| 9,812,374 | B1 * | 11/2017 | Refai-Ahmed | ..... H01L 23/3675 |
| 9,883,612 | B2 * | 1/2018 | Achard | ................. H01L 23/367 |
| 9,935,033 | B2 * | 4/2018 | Smith | ................... H01L 23/427 |

(Continued)

OTHER PUBLICATIONS

U.S. Appl. No. 17/688,803, filed Mar. 7, 2022 Entitled "Chip Package With Decoupled Thermal Management".

(Continued)

*Primary Examiner* — Dale E Page
*Assistant Examiner* — Rohit Parthasarathy
(74) *Attorney, Agent, or Firm* — Patterson + Sheridan, LLP

(57) ABSTRACT

Chip packages, electronic devices and method for making the same are described herein. The chip packages and electronic devices have a heat spreader disposed over a plurality of integrated circuit (IC) devices. The heat spreader has an opening through which a protrusion from an overlaying cover extends into contact with one or more of the IC devices to provide a direct heat transfer path to the cover. Another one or more other IC devices have a heat transfer path to the cover through the heat spreader. The separate heat transfer paths allow more effective thermal management of the IC devices of the chip package.

20 Claims, 7 Drawing Sheets

(56) References Cited

U.S. PATENT DOCUMENTS

| | | | | |
|---|---|---|---|---|
| 10,147,664 | B2 * | 12/2018 | Refai-Ahmed | H01L 24/73 |
| 10,262,920 | B1 * | 4/2019 | Refai-Ahmed | H01L 23/4275 |
| 10,720,377 | B2 * | 7/2020 | Refai-Ahmed | H01L 23/481 |
| 11,043,442 | B2 * | 6/2021 | Xu | H01L 23/4006 |
| 11,129,302 | B1 * | 9/2021 | Sochoux | H01L 23/3672 |
| 11,246,211 | B1 * | 2/2022 | Refai-Ahmed | H01L 23/4006 |
| 11,330,738 | B1 * | 5/2022 | Refai-Ahmed | H05K 1/0209 |
| 11,404,349 | B2 * | 8/2022 | Raravikar | H01L 23/3736 |
| 11,612,050 | B2 * | 3/2023 | Chen | H05K 1/0204 |
| 2006/0176666 | A1 * | 8/2006 | Saturley | G06F 1/20 |
| | | | | 361/679.46 |
| 2008/0068805 | A1 * | 3/2008 | Xu | H05K 7/20509 |
| | | | | 361/710 |
| 2013/0075889 | A1 * | 3/2013 | Pagaila | H01L 24/97 |
| | | | | 257/713 |
| 2014/0002989 | A1 * | 1/2014 | Ahuja | H01L 25/50 |
| | | | | 361/679.54 |
| 2014/0061894 | A1 * | 3/2014 | Chopin | H01L 21/56 |
| | | | | 165/185 |
| 2014/0239482 | A1 * | 8/2014 | Kourakata | H01L 21/52 |
| | | | | 165/185 |
| 2016/0284624 | A1 * | 9/2016 | Yamada | H01L 23/4338 |
| 2019/0206839 | A1 * | 7/2019 | Balakrishnan | H01L 25/18 |
| 2020/0152546 | A1 * | 5/2020 | Refai-Ahmed | H01L 23/481 |
| 2020/0357752 | A1 * | 11/2020 | Yazzie | H01L 23/562 |
| 2021/0305127 | A1 * | 9/2021 | Refai-Ahmed | H01L 23/4006 |
| 2023/0207422 | A1 * | 6/2023 | Refai-Ahmed | H01L 23/427 |
| | | | | 257/704 |
| 2023/0282547 | A1 * | 9/2023 | Refai-Ahmed | H01L 23/562 |
| | | | | 257/715 |
| 2023/0317555 | A1 * | 10/2023 | Yangyang | H01L 23/467 |
| | | | | 257/712 |

OTHER PUBLICATIONS

U.S. Appl. No. 17/564,114, filed Dec. 28, 2021 Entitled "Heat Spreader for a Semiconductor Package".
U.S. Appl. No. 17/142,926, filed Jan. 6, 2021 Entitled "Stress-Reduced Package Substrate and Method of Forming the Same".

* cited by examiner

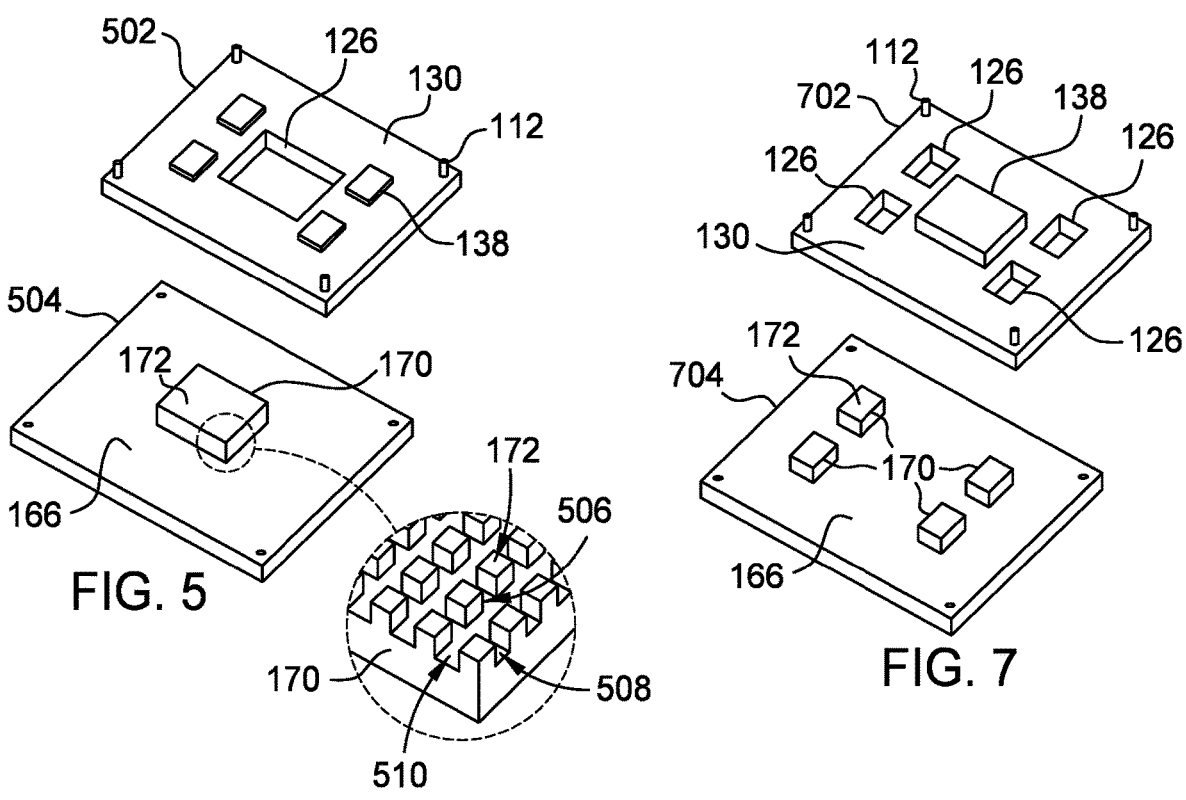
FIG. 5
FIG. 7
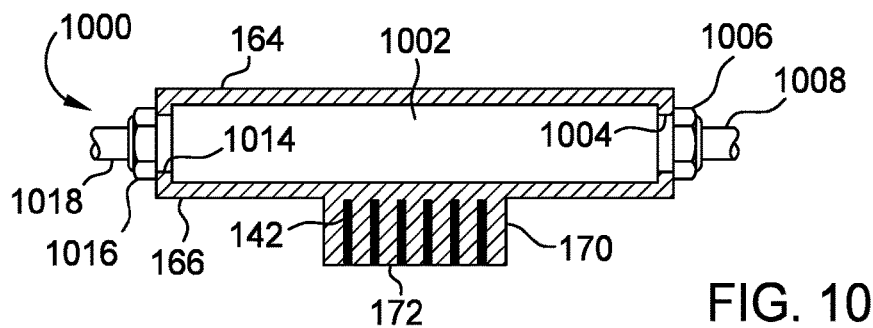
FIG. 10
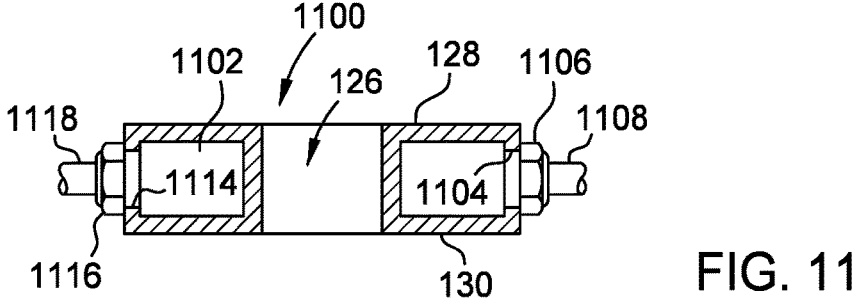
FIG. 11

CHIP PACKAGE WITH PASS THROUGH HEAT SPREADER

TECHNICAL FIELD

Embodiments of the present invention generally relate to mounting chip packages to printed circuit boards in electronic devices, and in particular, providing separate heat transfer paths from heat generating integrated circuit (IC) dies to covers.

BACKGROUND

Electronic devices, such as tablets, computers, server, in-door telecom, out-door telecom, industrial computers, high performance computing data centers, copiers, digital cameras, smart phones, control systems and automated teller machines, among others, often employ electronic components which leverage chip packages for increased functionality and higher component density. Conventional chip packaging schemes often utilize package substrates, often in conjunction with a through-silicon-via (TSV) interposer, to enable a plurality of integrated circuit (IC) dies to be mounted to a single substrate. The IC dies may include memory, logic, MEMS, RF or other IC device.

Although chip packaging has enabled increased device density and performance, the increased density and performance has also made managing the heat generated by the devices more challenging. In conventional chip packages, covers are often employed to conductively remove heat generated from the dies of the chip packages. However, covers utilized to provide improved heat transfer from the IC dies are generally limited by the amount of heat that can be transferred by direct thermal conduction. Moreover, chip packages having lids (i.e., heat spreaders) often undesirably have heat generated from higher powered IC dies that interferes with efficiently transferring heat from other IC dies within the chip package as essentially the entire heat load is forced through a common lid to the cover. Thus, some IC dies of lidded chip packages may not have efficient thermal conduction to the cover.

Therefore, a need exists for an improved configuration for enhancing the thermal management of chip packages.

SUMMARY

Chip packages, electronic devices and method for making the same are described herein. The chip packages and electronic devices have a heat spreader disposed over a plurality of integrated circuit (IC) devices. The heat spreader has an opening through which a protrusion from an overlaying cover extends into contact with one or more of the IC devices to provide a direct heat transfer path to the cover. Another one or more other IC devices have a heat transfer path to the cover through the heat spreader.

In one example, a chip package includes a substrate, first and second integrated circuit (IC) devices mounted on the substrate, a heat spreader and a cover. The heat spreader is disposed over the first IC device. The heat spreader has an opening. The cover is disposed over the heat spreader. The cover has a protrusion that extends through the opening in the heat spreader. The protrusion of the cover is disposed over the second IC device.

In one example, a chip package includes a substrate, a plurality of integrated circuit (IC) devices mounted on the package substrate, a heat spreader and a cover. The plurality of IC devices include a first IC device, a second IC device and a third IC device. The first and second IC devices each generate, when in use, more heat than each of the other IC devices of the plurality of IC devices. The heat spreader is disposed over the first IC device. The heat spreader has an opening. The first IC device and the third IC device have direct heat transfer paths to the heat spreader. The cover is disposed over the heat spreader. The cover has a protrusion extending through the opening in the heat spreader. The second IC device has a direct heat transfer path to the protrusion.

In yet another example, an electronic device is provided that includes a printed circuit board (PCB), a package substrate, a plurality of integrated circuit (IC) devices, a heat spreader, and a cover. The package substrate is mechanically and electrically coupled to the PCB. The plurality of IC devices are mechanically and electrically coupled to the package substrate. The plurality of IC devices include a first IC device, a second IC device and a third IC device. The first IC device has a higher power than the second IC, and the second IC device has a higher power than each of the other IC devices. The heat spreader is disposed over the first IC device and has a window. The cover is disposed over the heat spreader and has a protrusion extending through the window of the heat spreader. The second IC device has a direct heat transfer path to the protrusion. A first spring is provided that biases the heat spreader against the first IC device and the third IC device. A second spring is provided that biases the cover against the second IC device.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 5 is an exploded isometric bottom view of a heat spreader disposed over a cover.

FIG. 7 is another exploded isometric bottom view of a heat spreader disposed over a cover.

FIG. 10 is a schematic sectional view of another example of a cover.

FIG. 11 is a schematic sectional view of another example of a heat spreader.

To facilitate understanding, identical reference numerals have been used, where possible, to designate identical elements that are common to the figures. It is contemplated that elements of one embodiment may be beneficially incorporated in other embodiments.

DETAILED DESCRIPTION

Examples of electronic and photonic devices are provided that balance heat transfer paths to enhance temperature control of integrated circuit (IC) devices within a chip package such that stress, thermal regulation and performance of the IC devices of the chip package can be effectively managed. IC devices can include any of an IC die, a photonics die, and/or a chiplet. The chip packages and electronic devices disclosed herein include a heat spreader that includes an opening through which a projection from an overlaying cover extends into contact with one or more of the IC devices to provide a direct heat transfer path to the cover, while one or more other IC devices having a heat transfer path to the cover that passes through the heat spreader. Having two separate heat transfer paths to the cover prevents heat being removed from one IC device from adversely affecting the efficiency of heat removed from another IC device within the chip package. This arrangement of two separate heat transfer paths is particularly advantageous when the highest power IC dies, or the dies generating the most heat within a chip package, are serviced by separated heat transfer paths that don't both go through a common heat spreader on route to the cover. Such a configuration improves the thermal management of the IC dies of the chip packages. The improved thermal management provides better thermal regulation of all the IC devices within the chip package, and ultimately better performance.

Figure 1:
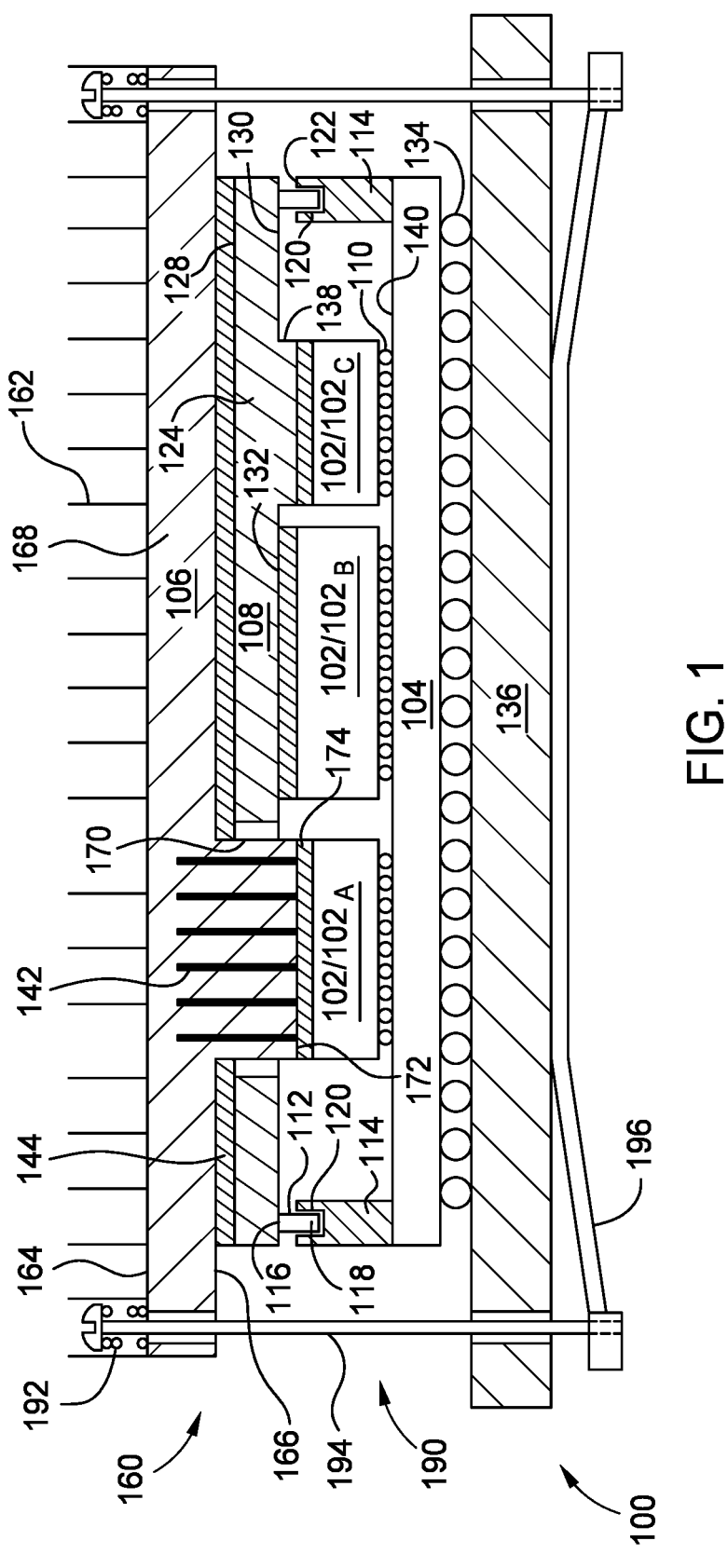
FIG. 1 is a schematic sectional view of an exemplary an electronic device having a chip package interfaced with a cover and a heat spreader.

Turning now to FIG. 1, an exemplary electronic device 100 is illustrated embodied as a chip package 160 mounted on a printed circuit board (PCB) 136. The chip package 160 include a plurality of IC devices 102 mounted on a substrate 104, a cover 106 and a heat spreader 108. As mentioned above and further discussed below, some of the plurality of IC devices 102 have a heat transfer path directly to the cover 106, while other of the plurality of IC devices 102 have a heat transfer path to the cover 106 that passes through the heat spreader 108. Although only one chip package 160 is illustrated interface with the cover 106 in FIG. 1, one or more additional chip packages 160 may be interfaced with a single cover 106.

The IC devices 102 of the chip package 160 include at least one IC die, and at least one or more of another IC and/or a chiplet. In the example depicted in FIG. 1, the IC devices 102 are shown as an IC die $102_A$, an IC die $102_B$, and an IC device $102_C$. The IC device $102_C$ may be either an IC die or chiplet. The IC die $102_A$ has a higher power consumption, and thus generates more heat, than the IC die $102_B$ at normal operating conditions. Similarly, the IC die $102_B$ has a higher power consumption, and thus generates more heat, than the IC device $102_C$ at normal operating conditions. In the example depicted in FIG. 1, the IC die $102_A$ has the highest power consumption, and thus generates the most heat, than the other IC devices 102 within the chip package 160, while the IC die $102_B$ has the second highest power consumption, and thus generates the second most amount of heat, than the other IC devices 102 within the chip package 160, at normal operating conditions. Alternatively, the IC die $102_B$ may have a highest power consumption, and the IC die $102_A$ may have the second highest power consumption of the IC devices 102 within the chip package 160.

In one example, at least one of the IC devices 102 may be a logic device (such as field programmable gate arrays (FPGA)), a memory device, an optical device, MEMS, RF, a processor or other IC logic structure. Optical devices include photo-detectors, lasers, optical sources, active or passive photonics devices, and the like. In another example, at least one of the IC devices 102 is a logic device while another one of the IC devices is a memory device (such as DRAM).

Figure 2:
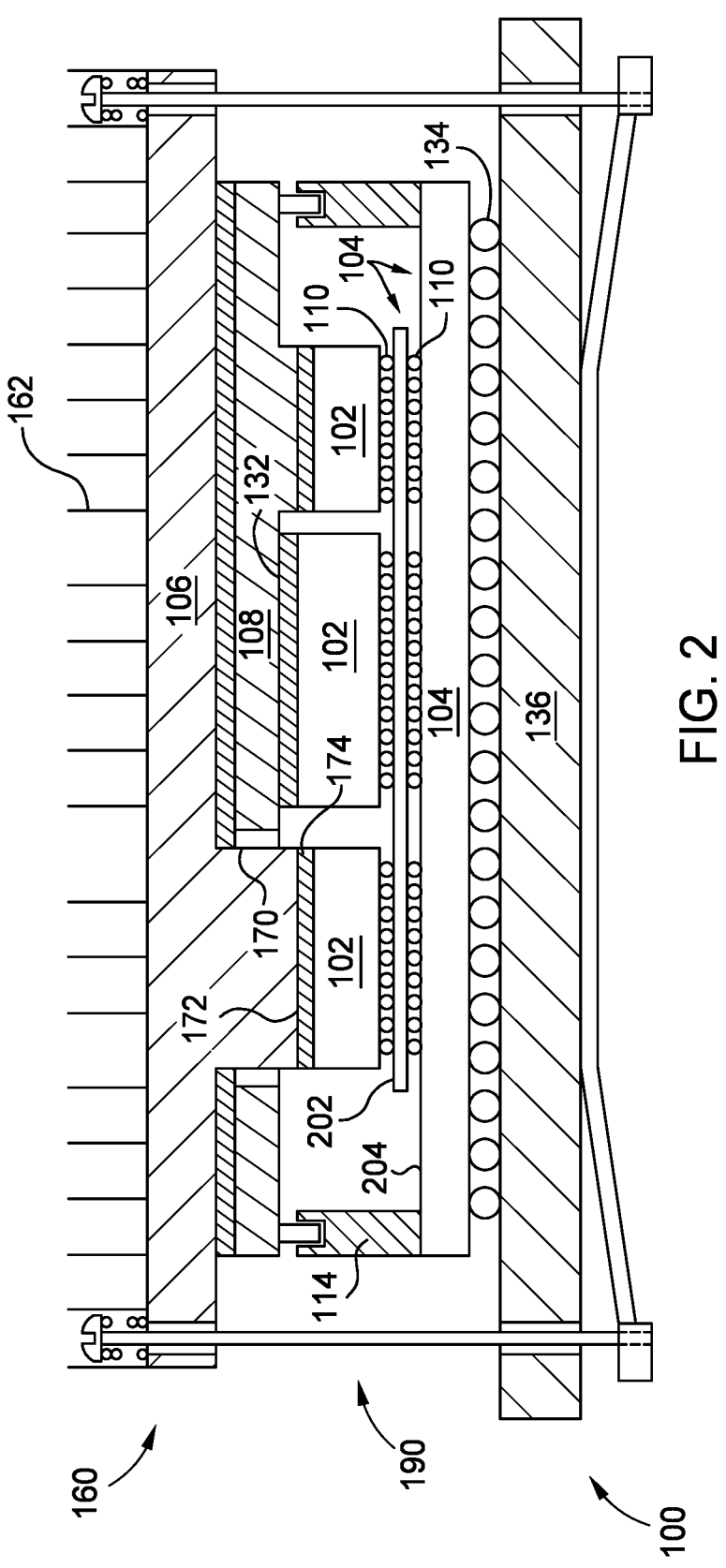
FIG. 2 is a schematic sectional view of another example of an electronic device having a chip package interfaced with a cover and a heat spreader.

The IC devices 102 are electrically and mechanically coupled to the substrate 104, for example using hybrid bonding or solder connections, such that the functional circuitry of the IC devices 102 is connected to the routing circuitry formed through the substrate 104. In FIG. 1, the substrate 104 is shown in form of a package substrate with solder connections 110 coupling the functional circuitry of the IC devices 102 to the routing circuitry of the substrate 104. Optionally, as shown in FIG. 2, the substrate 104 is shown in form of a silicon-through-via (TSV) interposer 202 mounted to a package substrate 204.

Continuing to refer to FIG. 1, the chip package 160 may have a monolithic construction, having the IC devices 102 connected side-by-side directly to the substrate 104, for example as flip chip ball grid array (FCBGA), ball grid array (BGA), wire bond and the like, In another alternative example, the chip package 160 may be configured to have two or more IC devices 102 arranged in a vertically stacked configuration, also known as a 3D or stacked die package. It is contemplated that the chip package 160 may have other configurations. The number of IC devices 102 forming the chip package 160 may range from two to as many as can be fit within the chip package 160 in order to meet design criteria. As generally the IC devices 102 of the chip package 160 are directly coupled to one of interposer or package substrate, the interposer or package substrate are sometimes both referred to as "the substrate 104" to which the IC devices 102 are mounted. The substrate 104 may be mounted and connected to the PCB 136, utilizing solder balls 134, wire bonding or other suitable technique, to form the electronic device 100.

The chip package 160 may optionally include a stiffener 114. The stiffener 114 is coupled to the substrate 104 and circumscribes the IC devices 102. The stiffener 114 can extend to peripheral edges of the substrate 104 to provide mechanical support which helps prevent the chip package 160 from bowing and warpage. The stiffener 114 may be a single layer structure or a multi-layer structure. The stiffener 114 may be made of ceramic, metal or other various inorganic materials, such as aluminum oxide ($Al_2O_3$), aluminum nitride (AlN), silicon nitride (SiN), silicon (Si), copper (Cu), aluminum (Al), and stainless steel, among other materials. The stiffener 114 can also be made of organic materials such as copper-clad laminate.

The stiffener 114 is mechanically decoupled (i.e., not directly mechanically connected) from the heat spreader 108. Mechanically decoupling the stiffener 114 from the heat spreader 108 reduces tolerance stacks or parallelism mismatch between the stiffener 114 and the heat spreader 108 such that stress is not induced on the chip package components or PCB, resulting in less warpage and delamination of the various layers and components of the chip package 160 compared to that which would be conventionally induced in IC packages having lids and stiffeners.

In one example, the heat spreader 108 is mechanically floating relative to the stiffener 114. A plurality of pins 112 are utilized to allow the heat spreader 108 to float relative to the stiffener 114. One end of each pin 112 is secured to one of the heat spreader 108 or the stiffener 114, while the other end of each pin 112 resides in a clearance hole in the other of the heat spreader 108 and the stiffener 114. In FIG. 1, one end 116 of the pin 112 is secured to the heat spreader 108, while the other end 118 of the pin 112 is disposed in a clearance hole 120 formed in a top 122 of the stiffener 114. The end 116 of the pin 112 may be secured to the heat spreader 108 using a press fit or other suitable technique.

The heat spreader 108 is fabricated from a thermally conductive plate 124. The thermally conductive plate 124 is fabricated from a material having good thermal conductivity, such as metal, metal alloy, carbon, or a mix of metal and metal alloy. Examples of suitable materials for fabricating the thermally conductive plate 124 include copper, nickel-plated copper or aluminum, among other suitable materials. The thermally conductive plate 124 may also include heat transfer enhancing elements 142, as further described below with reference to the cover 106. The thermally conductive plate 124 may alternatively be hollow such that a heat transfer fluid may be passed through the hollow interior of the thermally conductive plate 124, as further described below with reference to FIG. 10. The thermally conductive plate 124 has a top surface 128 that faces away from the IC devices 102 of the chip package 160, and a bottom surface 130 that faces the IC devices 102 and the substrate 104 of chip package 160.

The thermally conductive plate 124 of the heat spreader 108 includes an opening 126. The opening 126 is aligned above only one of the IC devices 102$_A$, 102$_B$. The opening 126 may optionally also be aligned above one or more additional IC devices 102. The opening 126 extends between the surfaces 128, 130 such that a protrusion 170 of cover 106 may pass through the heat spreader 108.

A thermally conductive interface material 132 is disposed between the bottom surface 130 of the heat spreader 108 and the IC devices 102 disposed directly below the heat spreader 108. The thermally conductive interface material 132 is configured to promote heat transfer between the IC devices 102 and the bottom surface 130 of the heat spreader 108. In one example, the thermally conductive interface material 132 includes a thermally conductive pad, and/or a thermally interface material (TIM), and/or a phase change material (PCM), and/or a liquid metal, and/or a liquid metal with polymer and/or a thermal putty. The thermally conductive pad, when present, may be fabricated from a thermally conductive material, such as copper, nickel-plated copper or aluminum, among other suitable material. An example of a thermally conductive pad is T630 Thermal Gel or A-Gap 580, available from Chomerics, a division of Parker Hannifin Corp. The thermally conductive pad may have a thickness of between about 0.5 mm and about 3.0 mm, although other thicknesses may be utilized. Examples of TIM thermal grease, thermal gels and the like are available from Shin-Etsu Chemical Co., Ltd., such as Shin Etsu X23 thermal greases. An example of a suitable PCM is Laird PCM 780. Examples of liquid metal include gallium, indium and the like. Other examples of materials suitable for the thermally conductive interface material 132 include INDALLOY and GALLITHERM, both available from Indium Corporation. Examples of thermal putty include TFLEX HD300 and TFLEX CR607, available from Laird Technologies.

Optionally, the conductive plate 124 may have one or more projections 138 extending from the bottom surface 130 to compensate for differences in height of the IC devices 102 that are in direct contact with the heat spreader 108 through the conductive interface material 132. Optionally, one or more of the projections 138 may be configured as a recess formed into the bottom surface 130 to accommodate taller IC devices 102.

The cover 106 is fabricated from a thermally conductive plate 168 that is stack above and in contact with the heat spreader 108. A thermally conductive interface material 144 may optionally be disposed between the cover and heat spreader 106, 108 to enhance heat transfer therebetween. The thermally conductive interface material 144 may be configured as described with reference to the thermally conductive interface material 132 disposed between the heat spreader 108 and IC devices 102. The thermally conductive plate 168 is fabricated from a material having good thermal conductivity, such as metal, metal alloy, carbon or a mix of metal and metal alloy. Examples of suitable materials for fabricating the thermally conductive plate 168 include copper, nickel-plated copper or aluminum, among other suitable materials. The thermally conductive plate 168 has a top surface 164 that faces away from the IC devices 102 and heat spreader 108 of the chip package 160, and a bottom surface 166 that faces and contact the heat spreader 108.

The top surface 164 of the cover 106 generally includes one or more heat dissipating structures 162. The heat dissipating structures 162 may be active and or passive heat transfer enhancing structures. Examples of active heat transfer enhancing structures include heat exchanger, refrigerant circulating tubes, fans and the like. Examples of passive heat transfer enhancing structures include heat transfer fins, heat pipes, and the like. In FIG. 1, the heat dissipating structures 162 are in the form of a plurality of fins.

Alternatively the cover 106 may include a hollow interior as shown in the cover 1000 depicted in FIG. 10. The cover 1000 may be utilized in place of the cover 106, and is essentially identical to the cover 106 except that the cover 1000 includes a hollow interior 1002. The cover 1000 includes two ports 1004, 1014 formed through the cover 1000 and connected to the hollow interior 1002. A fitting 1006 is installed in the port 1004, allowing a conduit 1008 to deliver a heat transfer fluid into the hollow interior 1002. Similarly, a fitting 1016 is installed in the port 1014, allowing a conduit 1018 to remove the heat transfer fluid from the hollow interior 1002. The flow of heat transfer fluid through the hollow interior 1002 removes heat from the cover 1000, effectively cooling the chip package 160. The top surface 164 of the cover 1000 may optionally include one or more heat dissipating structures 162, such as shown and described with reference to the cover 106 illustrated in FIG. 1.

Similar to the cover 1000, the heat spreader 108 may include a hollow interior as shown in a heat spreader 1100 depicted in FIG. 11. The heat spreader 1100 may be utilized with any of the covers described herein, or with other suitable covers. The heat spreader 1100 may be utilized in place of the heat spreader 108, and is essentially identical to the heat spreader 108 except that the heat spreader 1100 includes a hollow interior 1002. The heat spreader 1100 includes two ports 1104, 1114 formed through the heat spreader 1100 and connected to the hollow interior 1102. A fitting 1106 is installed in the port 1104, allowing a conduit 1108 to deliver a heat transfer fluid into the hollow interior 1102. Similarly, a fitting 1116 is installed in the port 1114, allowing a conduit 1118 to remove the heat transfer fluid from the hollow interior 1102. The flow of heat transfer fluid through the hollow interior 1102 removes heat from the heat spreader 1100, effectively cooling the chip package 160.

Returning to FIG. 1, the protrusion 170 of cover 106 extends from the bottom surface 166 of the cover 106 and through the opening 126 of the thermally conductive plate 124 of the heat spreader 108. In one example, a bottom surface 172 of the protrusion 170 of cover 106 extends at least to about or the bottom surface 130 of the heat spreader 108. However, the bottom surface 172 of the protrusion 170 may extend less than or beyond the bottom surface 130 of the heat spreader.

The protrusion 170 and/or other portions of the cover 106 may include one or more heat transfer enhancing elements 142 disposed therein. The heat transfer enhancing elements 142 may also be utilized in the other covers described herein, and/or in the heat spreaders described herein. The heat transfer enhancing elements 142 are generally comprised of a material having a coefficient of thermal conductivity greater than the bulk material comprising the protrusion 170 and/or the cover 106. In the example depicted in FIG. 1, a plurality of heat transfer enhancing elements 142 are illustrated in the form of posts disposed in the protrusion 170. The heat transfer enhancing elements 142 illustrated in FIG. 1 extend between the bottom surface 172 of the protrusion 170 towards the top surface 164 of the cover 106, for example, in a direction perpendicular to the top surface 164 of the cover 106. The heat transfer enhancing elements 142 may extend partially or completely to the top surface 164 of the cover 106. In one example, the heat transfer enhancing elements 142 are formed from industrial diamonds.

The bottom surface 172 of the protrusion 170 is aligned with the one of the IC devices $102_A$, $102_B$ that is exposed through the opening 126. The bottom surface 172 of the protrusion 170 may optionally also be aligned above one or more additional IC devices 102.

A thermally conductive interface material 174 is disposed between the bottom surface 172 of the protrusion 170 of the cover 106 the aligned IC devices 102 disposed directly below the bottom surface 172. The thermally conductive interface material 174 is configured to promote heat transfer between the IC devices 102 and the bottom surface 172 of the protrusion 170 of the cover 106. The thermally conductive interface material 174 may be configured as described with reference to the thermally conductive interface material 132 disposed between the heat spreader 108 and IC devices 102.

The bottom surface 172 of the protrusion 170 is urges against the IC device 102 by a spring force. The spring force is generated by a fastener system 190. The fastener system 190 includes a spring 192, a fastener 194 and an optional bracket 196. The fastener 194 is disposed through clearance holes formed in the cover 106 and the PCB 136. The spring 192 is captured between a head of the fastener 194 and the top surface 164 of the cover 106. A threaded end of the fastener 194 is engaged with a female threaded hole formed in the bracket 196. Alternatively, the threaded end of the fastener 194 is engaged with a female threaded hole formed in the PCB 136, a threaded insert coupled to the PCB 136, or a nut. The bracket 196, when used, is disposed on a side of the PCB 136 that faces away from the IC devices 102 and the substrate 104 of the chip package 160. In one example, the bracket 196 is a spring form that include contacts the PCB 136 directly below the chip package 160.

As the fastener 194 is tightened or loosened to set the compression of the spring 192, the force generated by the spring urges the bottom surface 172 of the protrusion 170 against the IC device 102, thus ensuring good thermal contact and heat transfer between the IC device 102 and the cover 106. The force of the spring 192 additionally urges the bottom surface 166 of the cover 106 against the top surface 128 of the heat spreader 108, thus ensuring good thermal contact and heat transfer between the heat spreader 108 and the cover 106.

In this manner, two separate heat transfer paths are defined between the IC devices 102 and the cover 106. The first heat transfer path is defined directly between the IC device $102_A$ and the cover 106 without passing through the heat spreader 108. The second heat transfer path is defined between the IC device $102_B$ and the cover 106 which passes through the heat spreader 108. The second heat transfer path also is utilized by the IC device $102_C$. By utilizing two separate heat transfer paths, heat transferring from the IC device $102_A$ to the cover 106 does not interfere with the efficiency of heat passing through the heat spreader 108 from the IC device $102_B$ to the cover 106. Thus, the two heat transfer paths allow each IC device $102_A$, $102_B$ to be thermally regulated more efficiently, resulting in better performance of the chip package 160.

Performance of the chip package 160 can be beneficially enhanced when the hottest or most power consuming IC device 102 utilizes one of the first or second heat transfer paths, while the next hottest or second most power consuming IC device 102 utilizes the other of the first or second heat transfer path. In the example depicted in FIG. 1, the hottest and most power consuming IC device $102_A$ utilizes the first or heat transfer path defined directly between the IC device $102_A$ and the cover 106 without passing through the heat spreader 108, while the next hottest and second most power consuming IC device $102_B$ utilizes the second heat transfer path defined from the IC device $102_B$ through the heat spreader 108 to the cover 106. The IC devices $102_C$ that consume less power and are cooler than IC devices device $102_A$, $102_B$ may utilize either of the first or second heat transfer paths. In the example depicted in FIG. 1, the cooler running IC devices $102_C$ do not share the same heat transfer path with the hottest and most power consuming IC device $102_A$, or in other words, the cooler running IC devices $102_C$ share the same heat transfer path with second hottest and second most power consuming IC device $102_B$. By using separate heat transfer paths, one of which by-passes the heat spreader, the two hottest IC devices $102_A$, $102_B$ can be effectively managed to keep from overheating and/or adversely affecting the performance of the other or others IC devices within the chip package 160. As a result, performance and reliability of both the IC devices and the chip package are enhanced.

Figure 3:
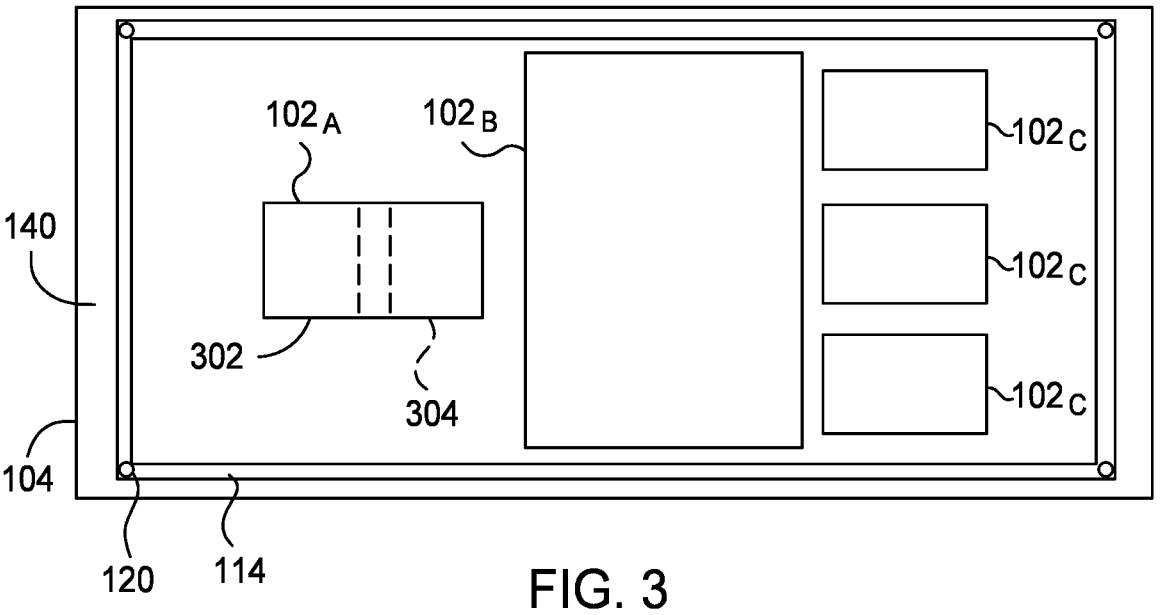
FIG. 3 is a plan view a substrate having a plurality of integrated circuit (IC) devices mounted thereon.
Figure 4:
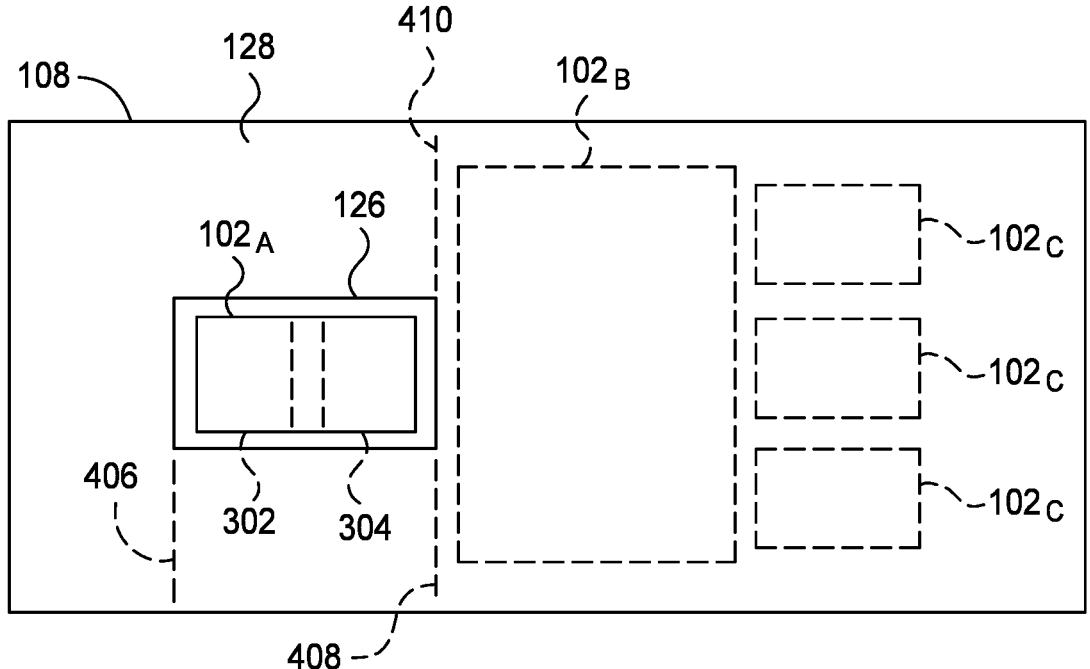
FIG. 4 is a plan view of a heat spreader disposed over the substrate of FIG. 3, the heat spreader having an opening through which at least one of the IC devices mounted on the substrate exposed though an opening formed.

FIG. 3 is a plan view the substrate 104 having the plurality of IC devices 102 mounted thereon prior to installation of the heat spreader 108. In FIG. 3, the IC devices 102 are shown as an IC device $102_A$, an IC device $102_B$ and three IC devices $102_C$. The IC device $102_A$ consumes more power and is hotter than the IC device $102_B$. The IC device $102_B$ consumes more power and is hotter than the three IC devices $102_C$. Any one or more the IC devices $102_C$ may be a chiplet or IC die. In the example depicted in FIG. 3, space consumed on the top surface 140 of the substrate 104 by the IC device $102_A$ may alternatively have two or more IC devices, shown as IC devices 302, 304. The IC device 302 is the hottest IC device attached to the substrate 104. The IC device 304 may consume more or less power that the next hottest IC device $102_B$. The IC devices 302, 304 are arranged on the top surface 140 of the substrate 104 such that the IC devices 302,

304 are aligned with the opening 126 formed through the heat spreader 108 to allow the protrusion 170 of the cover 106 to come in contact directly with IC devices 302, 304 without a portion of the heat spreader 108 disposed therebetween, as shown in FIGS. 1 and 4.

FIG. 4 is a plan view of the heat spreader 108 disposed over the substrate 104 of FIG. 3 illustrating the IC device 102$_A$ (or alternatively, the two or more devices 302, 304) exposed through the opening 126 in the heat spreader 108. In the example depicted in FIG. 4, the opening 126 formed through the heat spreader 108 is configured as a window, such that the opening 126 is surrounded on all sides by the heat spreader 108. Alternatively, the opening 126 formed through the heat spreader 108 may be configured as a notch or slot, having at least a portion of the opening 126 not surrounded by the heat spreader 108. For example, sides 406, 408 (shown in phantom in FIG. 4) of the opening 126 may extend to the edge of the heat spreader 108. In another alternative example, the opening 126 may be defined as the portion of the heat spreader 108 not covering the substrate 104, such as the sides 408, 410 of the opening 126 extending completely across the heat spreader 108 such that the IC devices 302, 304 are fully out from under the heat spreader 108 where the IC devices 302, 304 may be freely contacted directly by the cover 106.

FIGS. 5-8 provide some additional, non-limiting examples, of alternative configurations for covers and heat spreaders that may be utilized in place of the cover 106 and heat spreader 108 in an electronic device 100. Referring first to the exploded isometric bottom view of a heat spreader 502 disposed over a cover 504 depicted in FIG. 5, the heat spreader 502 includes a central opening 126 having optional projections 138 extending from the bottom surface 130 of the heat spreader 502. In the example depicted in FIG. 5, one or more projections 138 are disposed on one side of the opening 126, while one or more additional projections 138 are disposed on the opposite side of the opening 126.

Figure 6:
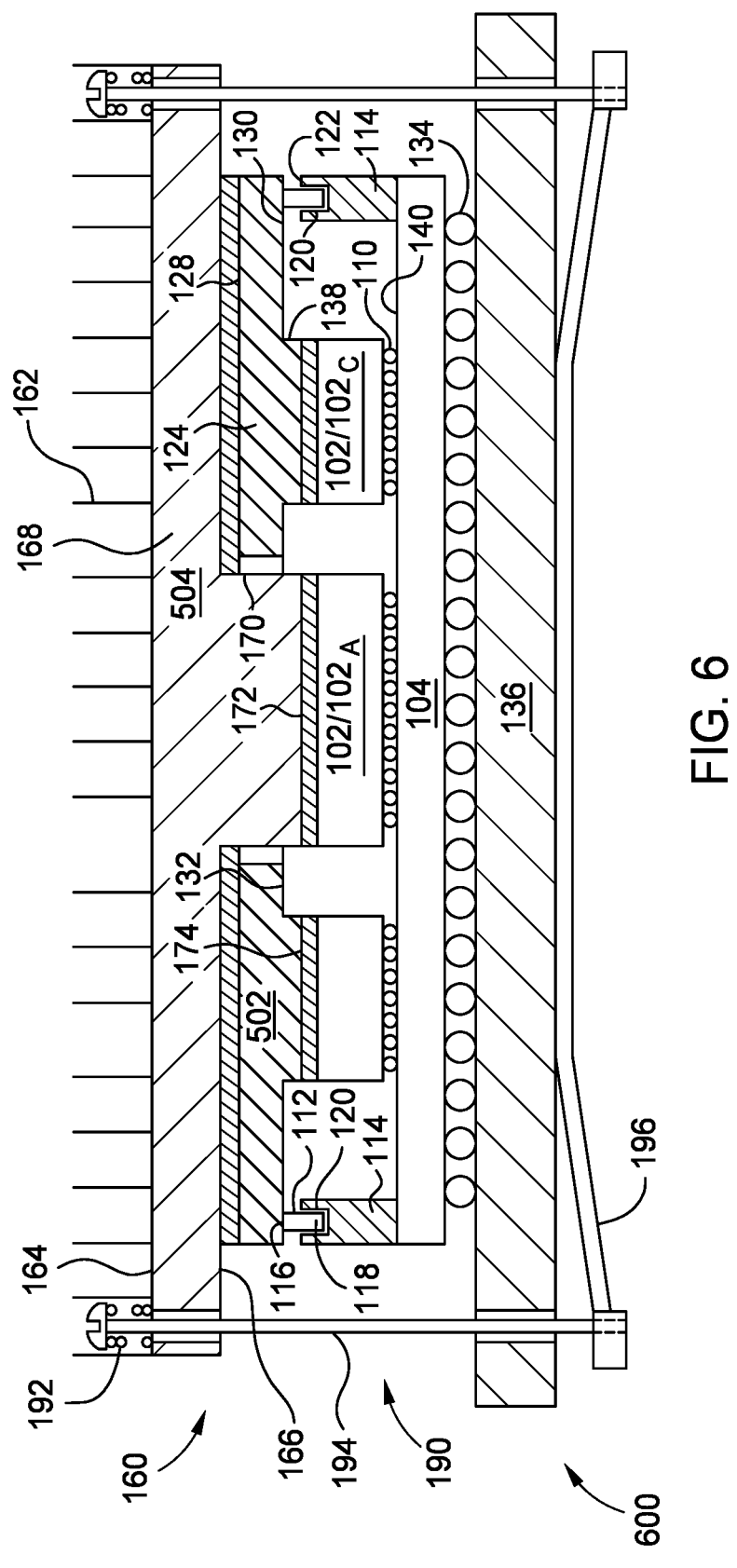
FIG. 6 is a schematic sectional view of an exemplary an electronic device having a chip package interfaced with the cover and the heat spreader illustrated in FIG. 5.
Figure 8:
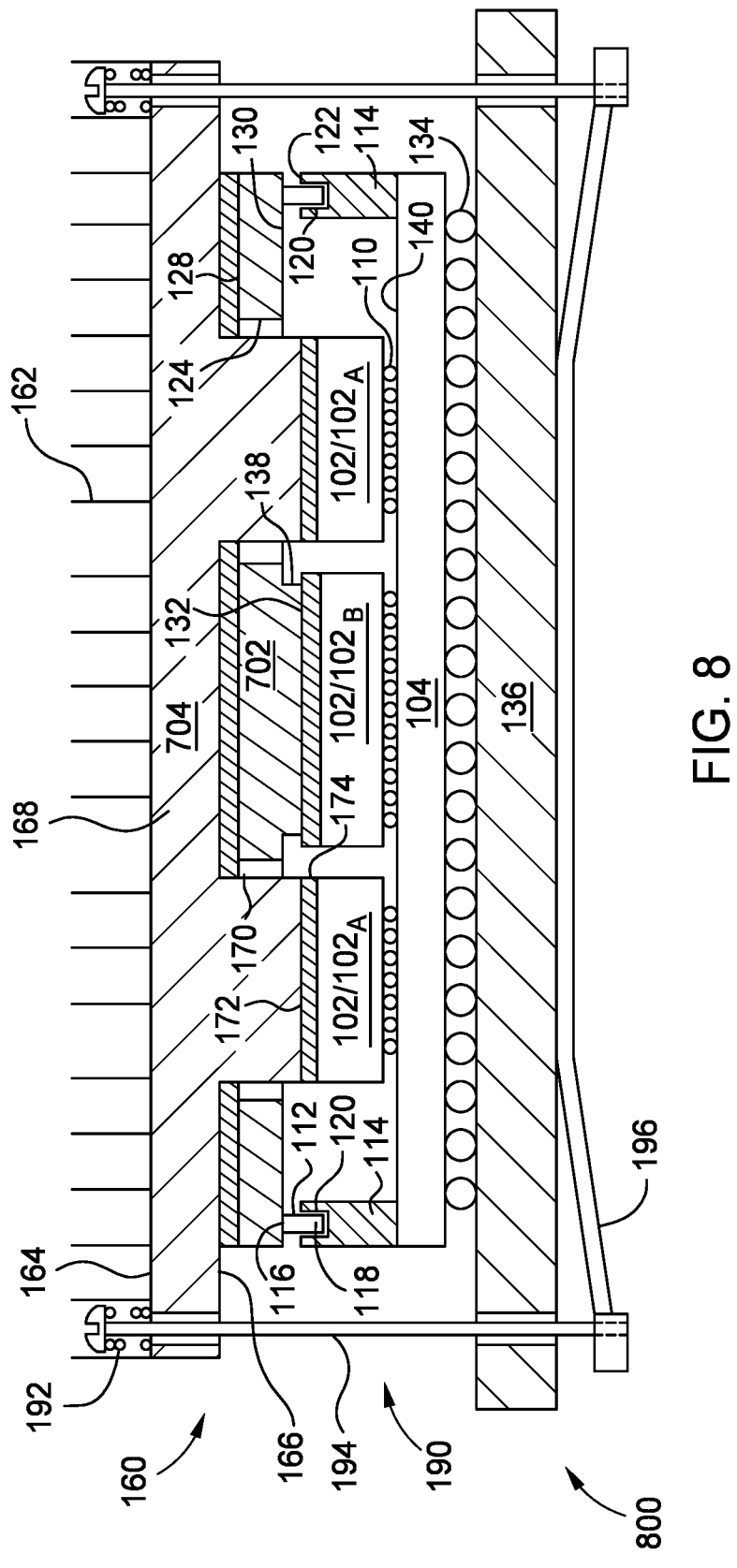
FIG. 8 is a schematic sectional view of an exemplary an electronic device having a chip package interfaced with the cover and the heat spreader illustrated in FIG. 7.

The cover 504 includes a central protrusion 170 that is sized to pass through the opening 126 formed through the heat spreader 502. The bottom surface 172 of the central protrusion 170 may be textured to increase the surface area available for heat transfer. The texture in the bottom surface 172 may be divots, recesses, grooves, grit blasted, etch or otherwise textured. In the example depicted in FIG. 5, the bottom surface 172 of the central protrusion 170 includes one or more first grooves 508. The grooves 508 may intersect with one or more second grooves 510. The intersecting grooves 508, 510 form a plurality of islands 506. The grooves 508, 510 and islands 506 increase the surface contact area between the thermally conductive interface material 174 disposed between the bottom surface 172 of the protrusion 170 of the cover 504 and the aligned IC devices 102 disposed directly below the bottom surface 172 (as shown in FIG. 6). The bottom surfaces of the optional projections 138, and/or one or both of the facing surfaces 128, 166 of the cover 704 and heat spreader 702 may also include grooves 508, 510 and islands 506, or other form of surface texture, to enhance heat transfer. In the example depicted in FIG. 6, the bottom surface 172 of the protrusion 170 of the cover 504 is in contact with the highest power IC device 102$_A$, while the one or more projections 138 are in contact with dies and/or chiplets that are rated and/or consume less power than the IC device 102$_A$.

Referring next to the exploded isometric bottom view of a heat spreader 702 disposed over a cover 704 depicted in FIG. 7, the heat spreader 702 includes a one or more openings 126 that are offset from a center of the heat spreader 702. An optional projection 138 may extend from the bottom surface 130 of the heat spreader 702. In the example depicted in FIG. 7, one or more projections 138 are disposed in the center of the heat spreader 702 between the openings 126. For example, one or more openings 126 are disposed to one side of the center projection 138 while one or more additional openings 126 are disposed on the opposite side of the center projection 138.

The cover 704 includes a number of protrusions 170 correspond to the openings 126 formed in the heat spreader 702. Each protrusion 170 is sized to pass through the openings 126 formed through the heat spreader 702. The bottom surface 172 of the central protrusion 170 may be textured as shown in FIG. 5 to increase the surface area available for heat transfer. The bottom surfaces of the optional projections 138 may also be textured to enhance heat transfer. In the example depicted in FIG. 8, the bottom surface 172 of the protrusions 170 of the cover 704 are in contact with the highest power IC devices 102$_A$, while the one or more center projections 138 are in contact with dies and/or chiplets that are rated and/or consume less power than the IC device 102$_A$.

Figure 9:
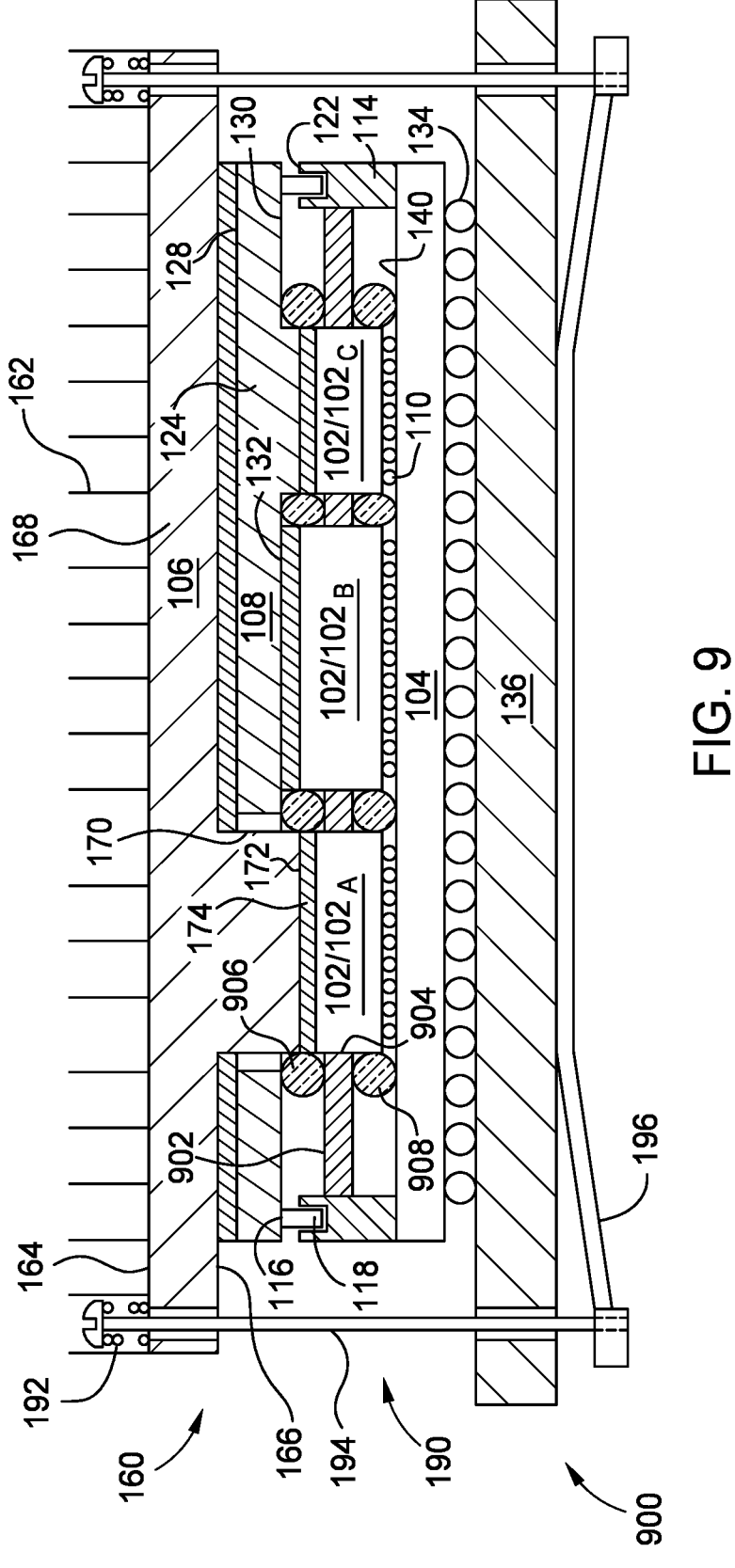
FIG. 9 is a schematic sectional view of an exemplary an electronic device having a chip package interfaced with a cover and a heat spreader, and additionally having a barrier gasket.

FIG. 9 is a schematic sectional view of an exemplary an electronic device 900 having a chip package 160 interfaced with a cover 106 and a heat spreader 108, and additionally having an optional barrier gasket 902. The chip package 160 is essentially the same as the chip package 160 described above, except for the barrier gasket 902. The barrier gasket 902 may be optionally utilized on other chip packages described herein, or other suitable chip package.

The barrier gasket 902 is disposed in the chip package 900 to prevent liquids from contacting the solder connections 110. The barrier gasket 902 is generally fabricated from a dielectric material, such as a polymer or elastomer. The barrier gasket 902 includes a plurality of apertures 904 arranged in a pattern complimentary to the pattern that the IC devices 102 are disposed on the substrate 104. In this manner, the barrier gasket 902 may be disposed around each of the IC devices 102, with a respective one of the IC devices 102 extending though a corresponding one of the apertures 904. With appropriately sized apertures 904, the barrier gasket 902 effectively seals against the sides of the IC devices 102 disposed on the substrate 104 to prevent thermally conductive interface material from moving to a location that might allow touching of the thermally conductive interface material and the active components of the IC device 102.

Optionally, seals 906, 908 may be interfaced with the barrier gasket 902 to assist preventing thermally conductive interface material from passing through apertures 904. For example, the seal 906 may be disposed on top of the barrier gasket 902 immediately outward of the aperture 904, the seal 906 circumscribing both the aperture 904 and the IC device 102 extending through the aperture 904. The seal 906 is compressed by the heat spreader 108 to substantially form a seal between the heat spreader 108 and barrier gasket 902 immediately outward of the aperture 904 and IC device 102. Similarly, the seal 908 may be disposed on the bottom of the barrier gasket 902 immediately outward of the aperture 904, the seal 908 circumscribing both the aperture 904 and the IC device 102 extending through the aperture 904. The seal 908 is compressed by the heat spreader 108 pushing against the seal 906 and barrier gasket 902 to substantially form a seal between the substrate 104 and barrier gasket 902 immediately outward of the aperture 904 and IC device 102.

Thus, examples of an electronic device and chip package have been disclosed that advantageously provide separate heat transfer paths to enhance temperature control of integrated circuit (IC) devices within the chip package. The separate heat transfer paths reduce stress, while improving the thermal regulation and performance of the IC devices of the chip package. Directing heat from one of the hottest IC devices directly to the cover without passing through the heat spreader enables more efficient temperature regulation of the other IC devices that conduct heat though the heat spreader to the cover. The balanced heat transfer path configuration improves the thermal management of the IC dies of the chip package, resulting in improved thermal regulation of all the IC devices within the chip package, and ultimately better performance.

While the foregoing is directed to embodiments of the present invention, other and further embodiments of the invention may be devised without departing from the basic scope thereof, and the scope thereof is determined by the claims that follow.

What is claimed is:

1. A chip package comprising:
a substrate;
a first integrated circuit (IC) device mounted on the substrate;
a second IC device mounted on the substrate;
a heat spreader disposed over the first IC device, the heat spreader having an opening;
a cover disposed against and mechanically decoupled from the heat spreader, the cover biasing the heat spreader against the first IC device, the cover having a protrusion extending through the opening in the heat spreader; the protrusion disposed over the second IC device; and
a fastener system coupled between the cover and the substrate, the fastener system configured to urge the cover toward the substrate, wherein the cover and the heat spreader are independently movable relative to a printed circuit board (PCB).

2. The chip package of claim 1 further comprising:
a first thermally conductive interface material is disposed between the first IC device and the heat spreader, the first thermally conductive interface material contacting the first IC device and the heat spreader.

3. The chip package of claim 2 further comprising:
a second thermally conductive interface material is disposed between the second IC device and the protrusion of the cover, the second thermally conductive interface material contacting the second IC device and the cover.

4. The chip package of claim 1, wherein the opening in the heat spreader is a notch or window.

5. The chip package of claim 1 further comprising:
a third IC device mounted on the substrate, wherein the first and second IC devices each have a power that is greater than a power of the third IC device.

6. The chip package of claim 5 further comprising:
a third thermally conductive interface material is disposed between the third IC device and the heat spreader, the third thermally conductive interface material contacting the third IC device and the heat spreader.

7. The chip package of claim 1, wherein the cover is biased towards the heat spreader.

8. The chip package of claim 7 further comprising:
a stiffener; and
a plurality of pins disposed between the heat spreader and the stiffener, at least one of the heat spreader and the stiffener having a plurality of holes that allow the pins to move therein.

9. The chip package of claim 1, wherein the cover further comprises at least one or more of an active heat transfer device or a passive heat transfer device.

10. The chip package of claim 1 further comprising:
a first thermally conductive interface material disposed between the first IC device and the heat spreader; and
a barrier gasket having apertures through which the first IC device and the second IC device extend therethrough, the barrier gasket disposed between first thermally conductive interface material and the substrate.

11. A chip package comprising:
a package substrate;
a plurality of integrated circuit (IC) devices mounted on the package substrate, the plurality of IC devices comprising a first IC device, a second IC device and a third IC device, the first and second IC devices each generating, when in use, more heat than each of the other IC devices of the plurality of IC devices;
a heat spreader disposed over the first IC device, the heat spreader having an opening, the first IC device and the third IC device having direct heat transfer paths to the heat spreader;
a cover disposed against and mechanically decoupled from the heat spreader, the cover biasing the heat spreader against the first IC device, the cover having a protrusion extending through the opening in the heat spreader; the second IC device having a direct heat transfer path to the protrusion; and
a fastener system coupled between the cover and the substrate, the fastener system configured to urge the cover toward the substrate, wherein the cover and the heat spreader are independently movable relative to a printed circuit board (PCB).

12. The chip package of claim 11 further comprising:
a first thermally conductive interface material disposed between the first IC device and the heat spreader, the first thermally conductive interface material contacting the first IC device and the heat spreader;
a second thermally conductive interface material disposed between the second IC device and the protrusion of the cover, the second thermally conductive interface material contacting the second IC device and the cover; and
a third thermally conductive interface material disposed between the third IC device and the heat spreader, the third thermally conductive interface material contacting the third IC device and the heat spreader.

13. The chip package of claim 11, wherein the opening in the heat spreader is a window.

14. The chip package of claim 11, wherein the cover is biased towards the heat spreader.

15. The chip package of claim 14 further comprising:
a stiffener; and
a plurality of pins disposed between the heat spreader and the stiffener, at least one of the heat spreader and the stiffener having a plurality of holes that allow the pins to move therein.

16. An electronic device comprising:
a printed circuit board (PCB);
a package substrate mechanically and electrically coupled to the PCB;
a plurality of integrated circuit (IC) devices mechanically and electrically coupled to the package substrate, the plurality of IC devices comprising a first IC device, a second IC device and a third IC device, the first IC device having a higher power than the second IC, and the second IC device having a higher power than each remaining other IC devices of the plurality of IC devices;

a heat spreader disposed over the first IC device, the heat spreader having a window;

a cover disposed against and mechanically decoupled from the heat spreader, the cover having a protrusion extending through the window of the heat spreader, the second IC device having a direct heat transfer path to the protrusion; and a spring biasing the cover against the second IC device, the cover biasing the heat spreader against the first IC device and the third IC device, wherein the cover and the heat spreader are independently movable relative to the PCB.

17. The electronic device of claim 16 further comprising:

a first thermally conductive interface material disposed between the first IC device and the heat spreader, the first thermally conductive interface material contacting the first IC device and the heat spreader;

a second thermally conductive interface material disposed between the second IC device and the protrusion of the cover, the second thermally conductive interface material contacting the second IC device and the cover; and a third thermally conductive interface material disposed between the third IC device and the heat spreader, the third thermally conductive interface material contacting the third IC device and the heat spreader.

18. The electronic device of claim 16, wherein the cover is biased towards the heat spreader.

19. The chip package of claim 1, wherein the second IC device generates, when in use, more heat than the first IC device.

20. The chip package of claim 19, wherein the protrusion of the cover is biased against the second IC device.

* * * * *